(12) United States Patent
Fujikata

(10) Patent No.: US 10,954,603 B2
(45) Date of Patent: Mar. 23, 2021

(54) SUBSTRATE HOLDER, PLATING APPARATUS, PLATING METHOD, AND ELECTRIC CONTACT

(71) Applicant: EBARA CORPORATION, Tokyo (JP)

(72) Inventor: Jumpei Fujikata, Tokyo (JP)

(73) Assignee: EBARA CORPORATION, Tokyo (JP)

(*) Notice: Subject to any disclaimer, the term of this patent is extended or adjusted under 35 U.S.C. 154(b) by 416 days.

(21) Appl. No.: 15/891,917

(22) Filed: Feb. 8, 2018

(65) Prior Publication Data
US 2018/0230620 A1 Aug. 16, 2018

(30) Foreign Application Priority Data
Feb. 16, 2017 (JP) .............................. JP2017-026909

(51) Int. Cl.
C25D 17/00 (2006.01)
C25D 17/12 (2006.01)
H01L 21/3205 (2006.01)
C25D 17/06 (2006.01)

(52) U.S. Cl.
CPC ......... C25D 17/001 (2013.01); C25D 17/005 (2013.01); C25D 17/06 (2013.01); C25D 17/12 (2013.01); H01L 21/32051 (2013.01)

(58) Field of Classification Search
CPC ............ C25D 7/12–126; C25D 17/001; C25D 17/005; C25D 17/06–17
See application file for complete search history.

(56) References Cited

U.S. PATENT DOCUMENTS

| 6,139,712 A * | 10/2000 | Patton ....................... C25D 7/12 205/137 |
| 2002/0029962 A1* | 3/2002 | Stevens .................. C25D 17/06 204/224 R |
| 2012/0043200 A1 | 2/2012 | Fujikata et al. |

FOREIGN PATENT DOCUMENTS

JP 2012-062570 A 3/2012

* cited by examiner

*Primary Examiner* — Alexander W Keeling
(74) *Attorney, Agent, or Firm* — BakerHostetler

(57) ABSTRACT

A substrate holder includes: a first holding member having a surface configured to come into contact with the substrate; and a second holding member, between which and the first holding member the substrate is put and held. The second holding member includes a removal portion that is disposed along an outer circumference of the substrate and configured to come into contact with the substrate and remove an insulating material on the substrate when the substrate is put between the first holding member and the second holding member, and an electric contact portion that is disposed along the outer circumference of the substrate and configured to come into contact with a region on the substrate in which the removal portion has removed the insulating material when the substrate is put and held between the first holding member and the second holding member.

13 Claims, 11 Drawing Sheets

SUBSTRATE HOLDER, PLATING APPARATUS, PLATING METHOD, AND ELECTRIC CONTACT

CROSS-REFERENCE TO RELATED APPLICATION

This application is based upon and claims benefit of priority from Japanese Patent Application No. 2017-026909 filed on Feb. 16, 2017, the entire contents of which are incorporated herein by reference.

TECHNICAL FIELD

The present invention relates to a substrate holder, a plating apparatus, a plating method, and an electric contact.

BACKGROUND ART

There have hitherto been formed wires in fine grooves for wiring, holes, or a resist opening provided on the surface of a semiconductor wafer or the like, and bumps (salient electrodes) on the surface of the semiconductor wafer or the like, the bumps being electrically connected to an electrode of a package or the like. As a method for forming these wires and bumps, for example, an electroplating method, a vapor deposition method, a printing method, a ball bump method, and some other method are known. With increase in number of inputs and outputs of semiconductor chips and with reduction in pitch, the electroplating method has been increasingly used, in which a finer process can be performed and the performance is relatively stable.

The plating apparatus used for the electroplating method includes a substrate holder that holds a substrate such as a semiconductor wafer by sealing the end surface and the back surface of the semiconductor wafer while exposing the front surface (plated surface) thereof. When plating treatment is performed on the substrate surface in this plating apparatus, the substrate holder holding the substrate is immersed into a plating solution (e.g., Japanese Patent Laid-Open No. 2012-62570).

Herein, at the time of performing the plating treatment on the substrate held in the substrate holder, the substrate needs to be electrically connected to the negative voltage side of a power source so that a negative voltage is applied to the substrate surface. For this reason, the substrate holder is provided with an electric contact for electrically connecting between the substrate and the wire extended from the power source. The electric contact is configured to come into contact with a seed layer (conductive layer) formed on the substrate surface, whereby a negative voltage is applied to the substrate.

CITATION LIST

Patent Literature

PTL1: Japanese Patent Laid-Open No. 2012-62570

SUMMARY OF INVENTION

Technical Problem

In order to improve the uniformity of the thickness of the plating film formed on the plated surface of the substrate, a plurality of electric contacts are preferably brought into contact with the seed layer along the circumferential edge of the substrate to uniformly apply a voltage to the plated surface of the substrate. However, even when a voltage is uniformly applied to the plated surface of the substrate, the in-plane uniformity of the thickness of the plating film deteriorates if there are variations in contact resistance between each of the plurality of electric contacts and the seed layer of the substrate. Specifically, when the contact resistance between each of the plurality of electric contacts and the seed layer varies, a current hardly flows in a portion with higher contact resistance to make the film thickness in the vicinity thereof smaller, and a current easily flows in a portion with lower contact resistance to make the film thickness in the vicinity thereof larger.

Such variations in contact resistance tends to occur especially when an insulating thin film is formed on the substrate, or a residual of an organic matter remains on the surface, in a process prior to the plating. For example, in a case where the insulating thin film has been formed on the substrate, variations in contact resistance among the electric contacts increase when some of the electric contacts pass through this thin film to have direct electric continuity with the seed layer, while the other electric contacts do not pass through the thin film and are in contact with the thin film. Further, in a case where the residual of the organic matter remains on the substrate, variations in contact resistance among the electric contacts increase when some of the electric contacts come into contact with a region on the substrate, in which no residual of the organic matter remains, to have direct electric continuity with the seed layer, while the other electric contacts are in contact with a region on the substrate in which the residual of the organic matter remains. As thus described, when the insulating material such as the thin film or the residual is on the surface of the seed layer of the substrate, the uniformity of the thickness of the plating film deteriorates, which is problematic.

The present invention has been made in view of the above problem. An object of the present invention is to prevent variations in contact resistance between an electric contact and a seed layer even when an insulating material such as a thin film or a residual is on the surface of the seed layer of a substrate.

Solution to Problem

According to one aspect of the present invention, a substrate holder for holding a substrate is provided. This substrate holder includes: a first holding member having a surface configured to come into contact with the substrate; and a second holding member, between which and the first holding member the substrate is put and held. The second holding member includes a removal portion that is disposed along an outer circumstance of the substrate when the substrate is put between the first holding member and the second holding member, and configured to come into contact with the substrate and remove an insulating material on the substrate, and an electric contact portion that is disposed along the outer circumference of the substrate and configured to come into contact with a region on the substrate in which the removal portion has removed the insulating material when the substrate is put and held between the first holding member and the second holding member. The removal portion is located closer to the surface than the electric contact portion is when the first holding member and the second holding member are disposed facing each other.

According to another aspect of the present invention, there is provided a plating method for plating a substrate held in a substrate holder including a first holding member and a second holding member. This plating method includes the steps of: putting the substrate between the first holding member and the second holding member to hold the substrate in the substrate holder; and plating the substrate held in the substrate holder. The holding step includes scraping the insulating material on the substrate by using a removal portion provided in the second holding member, and bringing an electric contact portion provided in the second holding member into contact with a region on the substrate in which the removal portion has removed the insulating material.

According to another aspect of the present invention, there is provided an electric contact configured to come into contact with the substrate in order to allow a current to flow on the substrate. This electric contact includes: a leg that electrically connected to an external power source, a body extending from the leg, and a tip extending in an inclined manner from the body. The tip includes a removal portion configured to come into contact with the substrate and remove an insulating material on the substrate, and an electric contact portion configured to come into contact with a region on the substrate in which the removal portion has removed the insulating material.

DESCRIPTION OF EMBODIMENTS

Figure 1:
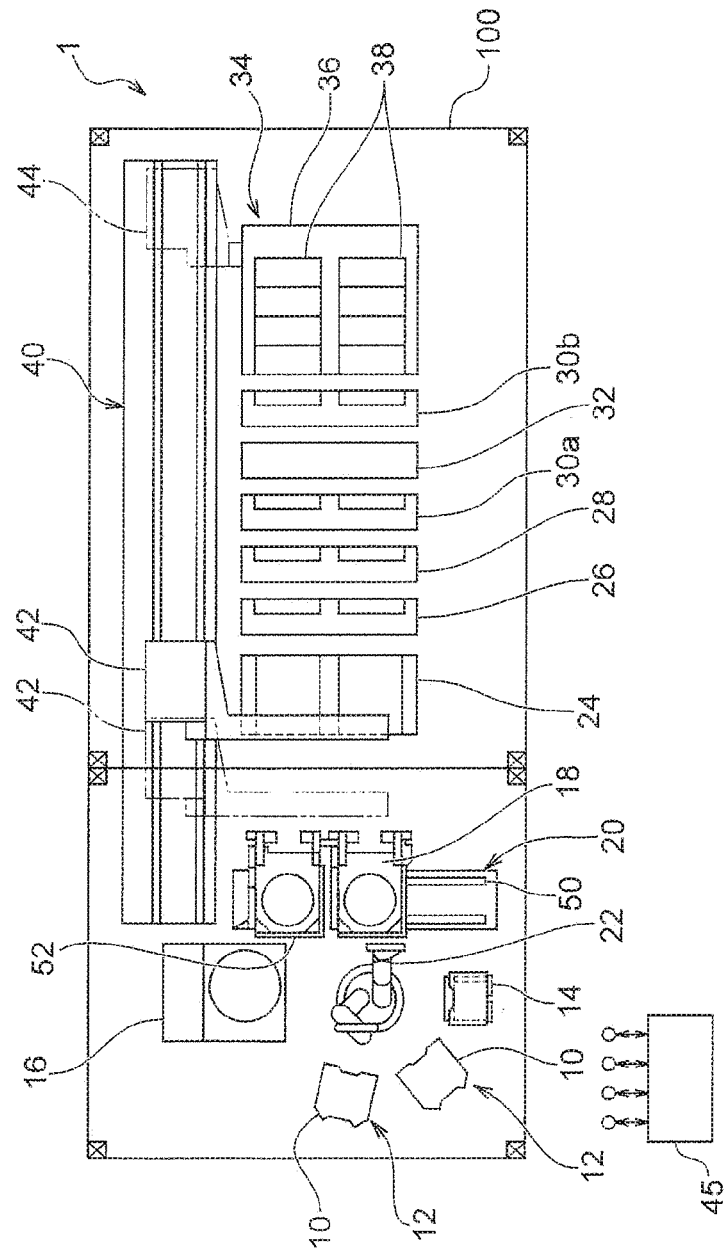
FIG. 1 is a general layout diagram of a plating apparatus according to the present embodiment.

A plating apparatus according to an embodiment of the present invention will be described below with reference to the drawings. In the drawings described below, the same or corresponding constituents are provided with the same numeral and a repeated description will be omitted.

FIG. 1 is a general layout diagram of the plating apparatus according to the present embodiment. As shown in FIG. 1, the whole of a plating apparatus 1 is surrounded by a frame 100, and a space surrounded by the frame 100 is delimited as the plating apparatus 1. The plating apparatus 1 includes two cassette tables 12, an aligner 14, a substrate setting/removing unit 20, and a cleaning device (spin rinse drier) 16. A cassette 10 housing a substrate such as the semiconductor wafer is mounted on the cassette table 12. The aligner 14 is configured to align positions of an orientation flat, a notch, and the like of the substrate with a predetermined direction. The substrate setting/removing unit 20 sets and removes the substrate into and out of a placed substrate holder 18. The cleaning device 16 supplies a cleaning solution (pure water) for cleaning the substrate surface, while rotating the substrate after plating treatment, to clean the substrate and then rotates the substrate at a high speed to dry the substrate surface. At the substantially center of these units, there is disposed a substrate carrier device 22 which is a carrier robot, for example, for carrying the substrate among these units.

The substrate setting/removing unit 20 includes a flat placement plate 52 horizontally slidable along a rail 50. With two substrate holders 18 placed parallelly in a horizontal state on the placement plate 52, the substrate carrier device 22 passes or receives the substrate to and from one substrate holder 18. Thereafter, the substrate carrier device 22 horizontally slides the placement plate 52 to pass or receive the substrate to and from another substrate holder 18.

Further, the plating apparatus 1 includes a stocker 24, a pre-wetting bath 26, a pre-soaking bath 28, a first cleaning bath 30a, a blow bath 32, a second cleaning bath 30b, and a plating bath 34. In the stocker 24, the substrate holder 18 is stored and temporarily stored. In the pre-wetting bath 26, the substrate is immersed into the pure water and the substrate surface is hydrophilized. In the pre-soaking bath 28, an oxide film on the surface of a conductive layer such as a seed layer, which is formed on the substrate surface, is etched and removed. In the first cleaning bath 30a, the pre-soaked substrate is cleaned by the cleaning solution (pure water, etc.) along with the substrate holder 18. In the blow bath 32, the cleaned substrate is drained. In the second cleaning bath 30b, the plated substrate is cleaned by the cleaning solution along with the substrate holder 18. The stocker 24, the pre-wetting bath 26, the pre-soaking bath 28, the first cleaning bath 30a, the blow bath 32, the second cleaning bath 30b, and the plating bath 34 are disposed in this order.

The plating bath 34 includes an overflow bath 36 and a plurality of plating units 38 housed inside the overflow bath 36. Each plating unit 38 houses the substrate holder 18 on the inside and immerses the substrate into the plating solution. In the plating unit 38, a voltage is applied between the substrate and an anode to plate the substrate surface with, for example, copper. Note that a similar plating apparatus 1 can be used in plating with nickel, solder, silver, gold, or the like, other than copper.

Further, the plating apparatus 1 is provided with a substrate holder carrier device 40 for carrying the substrate holder 18. The substrate holder carrier device 40 is, for example, a linear motor system and located lateral to the substrate setting/removing unit 20 and each bath described above. This substrate holder carrier device 40 includes a first transporter 42 and a second transporter 44. The first transporter 42 carries the substrate between the substrate setting/removing unit 20 and the stocker 24. The second transporter 44 carries the substrate among the stocker 24, the pre-wetting bath 26, the pre-soaking bath 28, the first cleaning bath 30a, the second cleaning bath 30b, the blow bath 32, and the plating bath 34. Note that this substrate holder carrier device 40 may include any one of the first transporter 42 and the second transporter 44.

The plating apparatus 1 includes a control unit 45 configured to control operation of each unit in the plating apparatus 1 described above. The control unit 45 includes, for example, a computer readable recording medium that stores a predetermined program for causing the plating apparatus 1 to perform a plating process, and a central processing unit (CPU) for running the program in the recording medium. The control unit 45 can, for example, control the setting/removal operation of the substrate setting/removing unit 20, control the carriage of the substrate carrier device 22, control the carriage of the substrate holder carrier device 40, and control a plating current and the time for plating in the plating bath 34. As the storage medium included in the control unit 45, it is possible to adopt a freely selectable recording medium which is a magnetic medium such as a flexible disk, a hard disk, or a memory storage, an optical medium such as a CD or a DVD, or a magneto-optical medium such as an MO or an MD.

Figure 2:
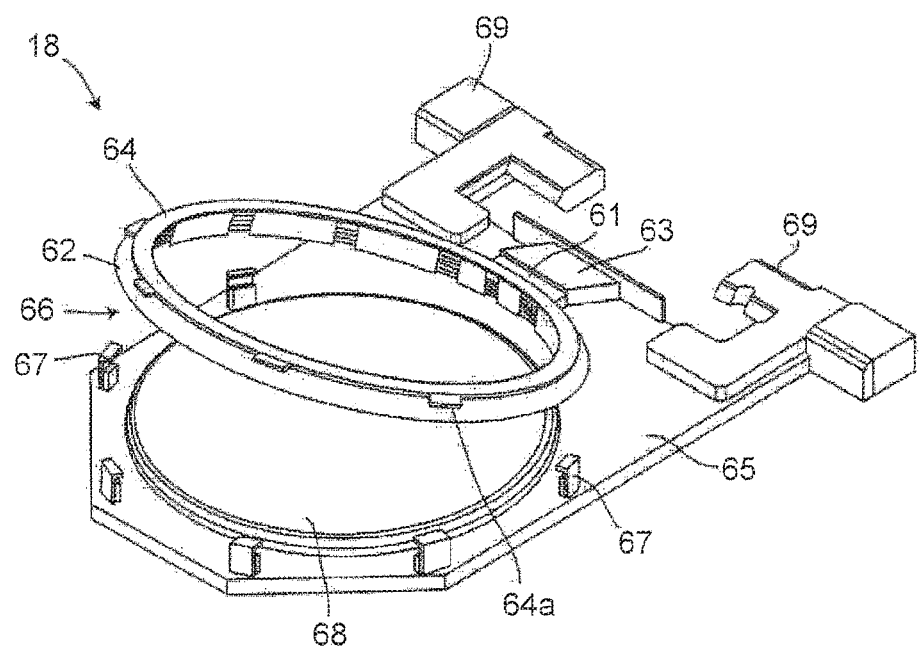
FIG. 2 is a perspective view of a substrate holder used in the plating apparatus shown in FIG. 1.

FIG. 2 is a perspective view of the substrate holder 18 used in the plating apparatus shown in FIG. 1. As shown in FIG. 2, the substrate holder 18 includes a first holding member 65 made of vinyl chloride, for example, and having a rectangular flat shape, and a second holding member 66 fitted openably/closably to this first holding member 65 via a hinge 63. A holding surface 68 for holding the substrate is provided in the substantially center of the first holding member 65 of the substrate holder 18. On the outer circumference of the holding surface 68 of the first holding member 65, reversed L-shaped dampers 67 each having a protrusion that protrudes inward are provided at regular intervals along the circumference of the holding surface 68.

A pair of substantially T-shaped hands 69 is coupled to the end of the first holding member 65 of the substrate holder 18, the hands 69 serving as a support portion at the time of carrying the substrate holder 18 or supporting the substrate holder 18 by suspension. In the stocker 24 shown in FIG. 1, the hands 69 are hung on the upper surface of the peripheral wall of the stocker 24, so that the substrate holder 18 is vertically supported by suspension. The hands 69 of the substrate holder 18 supported by suspension are grasped by the first transporter 42 or the second transporter 44, to carry the substrate holder 18. Also in the pre-wetting bath 26, the pre-soaking bath 28, the first cleaning bath 30a, the second cleaning bath 30b, the blow bath 32, and the plating bath 34, the substrate holder 18 is supported by suspension on the respective peripheral walls thereof via the hands 69.

Further, an external contact, which is not shown and configured to be connected to an external power source, is provided on the hand 69. This external contact is electrically connected to a plurality of relay contacts 88 (cf. FIGS. 3A and 3B) provided on the outer circumference of the holding surface 68 via a plurality of wires.

The second holding member 66 includes a base portion 61 fixed to the hinge 63, and a ring-like seal holder 62 fixed to the base portion 61. A press ring 64 for pressing and fixing the seal holder 62 to the first holding member 65 is rotatably mounted in the seal holder 62 of the second holding member 66. The press ring 64 has a plurality of externally protruding projections 64a on the outer circumference. The upper surface of the projection 64a and the lower surface of the inward protrusion of the damper 67 have taper surfaces inclined in directions opposite to each other along the rotational direction.

At the time of holding the substrate, the substrate is first placed on the holding surface 68 of the first holding member 65, with the second holding member 66 in an open state, and the second holding member 66 is then closed so that the substrate is put between the first holding member 65 and the second holding member 66. Subsequently, the press ring 64 is rotated clockwise to slip the projection 64a of the press ring 64 to the inside (the lower side) of the inward protrusion of the damper 67. This makes the first holding member 65 and the second holding member 66 fastened to each other and locked via the taper surfaces provided respectively on the press ring 64 and the dampers 67, to hold the substrate. The plated surface of the substrate held is exposed outside. At the time of canceling the hold of the substrate, the press ring 64 is rotated counterclockwise, with the first holding member 65 and the second holding member 66 in the locked state. This makes the projection 64a of the press ring 64 removed from the reversed L-shaped dampers 67 to cancel the hold of the substrate.

Figure 3A:
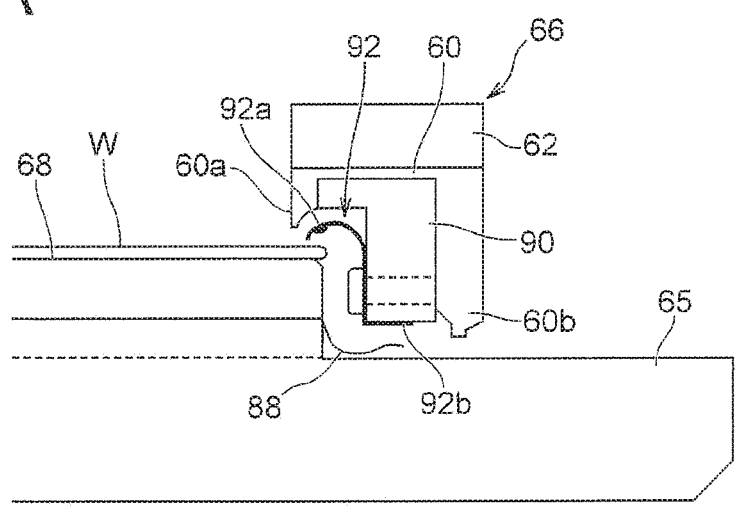
FIG. 3A is a partial sectional view of the substrate holder before a substrate is held.
Figure 3B:
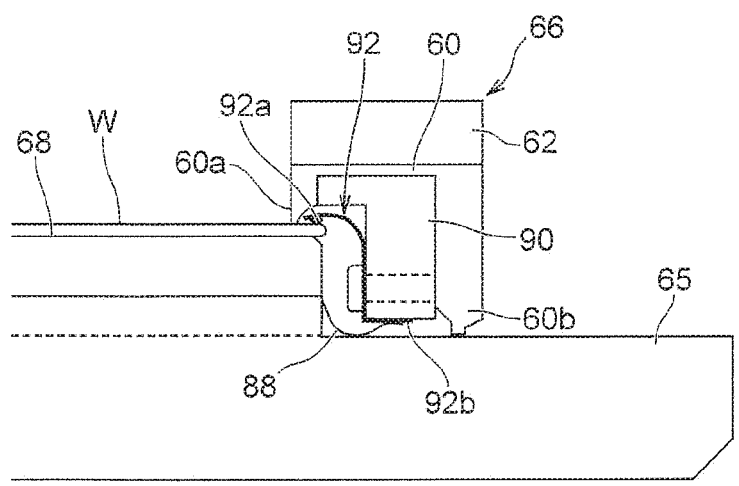
FIG. 3B is a partial sectional view of the substrate holder after the substrate is held.

FIG. 3A is a partial sectional view of the substrate holder 18 before the substrate is held, and FIG. 3B is a partial sectional view of the substrate holder 18 after the substrate is held. In the example shown in FIGS. 3A and 3B, a substrate W is placed on the holding surface 68 of the first holding member 65. A plurality of relay contacts 88 (one relay contact in the figure), connected to a plurality of wires extending from the external contact provided on the hand 69 shown in FIG. 2, are disposed between the holding surface 68 and the first holding member 65. The relay contact 88 is configured to feed a current from the external power source to an electric contact 92 described later. A plurality of relay contacts 88 are disposed outside the circumference of the substrate W so that the end of the relay contact 88 is exposed in the state of having spring characteristics on the surface of the first holding member 65 lateral to the substrate W when the substrate W is placed on the holding surface 68 of the first holding member 65.

A seal member 60, which is pressure-welded to the outer circumference of the surface of the substrate W and the first holding member 65 when the substrate W is held in the substrate holder 18, is fitted to the surface (the lower surface in the figure) of the seal holder 62 which faces the first holding member 65. The seal member 60 has a lip portion 60a for sealing the surface of the surface of the substrate W and a lip portion 60b for sealing the surface of the surface of the first holding member 65. That is, the seal member 60 is configured to seal between the circumferential edge of the substrate and the surface of the first holding member 65.

A support 90 is fitted to an interior portion sandwiched between the pair of lip portions 60a, 60b of the seal member 60. A plurality of electric contacts 92, configured such that the electricity is fed from the relay contact 88, are fixed to the support 90 by using screws, for example, to be disposed along the outer circumference of the substrate W. The electric contact 92 includes a tip 92a extending toward the inside of the holding surface 68 and a leg 92b configured to be contactable with the relay contact 88. The plurality of electric contacts 92 are preferably connected electrically to each other. In this case, even when the electric contacts 92 are connected to the external power source through respectively different wires, each of the electric contacts 92 has the same potential and hence currents to be fed by the electric contacts 92 to the substrate W can be made uniform. In this substrate holder 18, in order to electrically connect the plurality of electric contacts 92 to each other, each of the electric contacts 92 may be fitted to the support 90 such that the electric contacts 92 come into direct contact with each other or, for example, a ring-like conductive connection member may be provided for connecting the plurality of electric contacts 92 to each other.

When the first holding member 65 and the second holding member 66 shown in FIG. 2 are locked, as shown in FIG. 3B, the short lip portion 60*a* on the inner circumference side of the seal member 60 is pressed to the surface of the substrate W, and the long lip portion 60*b* on the outer circumference side is pressed to the surface of the first holding member 65. Accordingly, the space between the lip portion 60*a* and the lip portion 60*b* is reliably sealed and the substrate W is held.

In the region sealed by the seal member 60, namely, the region sandwiched between the pair of lip portions 60*a*, 60*b* of the seal member 60, the relay contact 88 is electrically connected to the leg 92*b* of the electric contact 92, and the tip 92*a* comes into contact with the conductive layer of the substrate W, such as the circumferential edge of the seed layer. Hence the electricity can be fed to the substrate W via the electric contact 92 in a state where the substrate W is held in the substrate holder 18 while sealed by the seal member 60.

Figure 4:
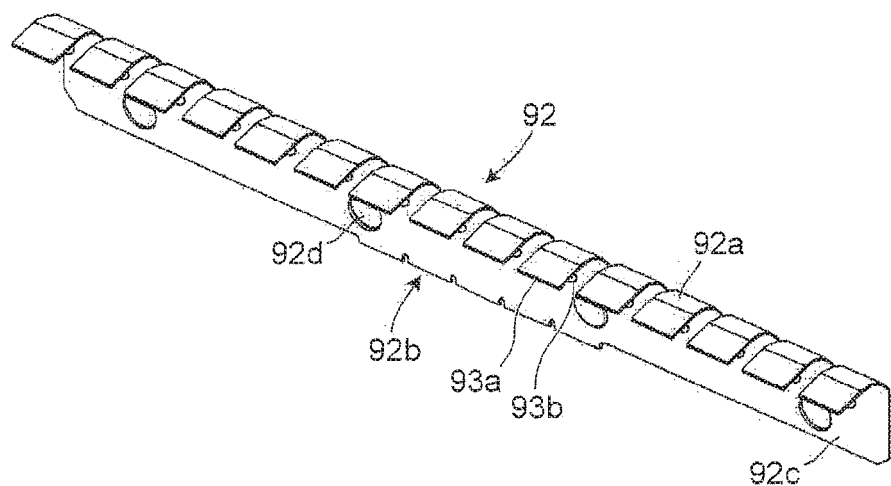
FIG. 4 is a perspective view of an electric contact.

Next, the configuration of the electric contact 92 shown in FIGS. 3A and 3B will be described in detail. FIG. 4 is a perspective view of the electric contact 92. As shown in FIG. 4, the electric contact 92 includes the leg 92*b* electrically connected to the external power source via the relay contact 88 (see FIGS. 3A and 3B), a body 92*c* extending in a substantially vertical direction from the leg 92*b*, and a plurality of tips 92*a* extending in an inclined manner from the body 92*c*. The electric contact 92 is formed by bending a plate-like conductive member and has elasticity like a flat spring. The surface of the electric contact 92 may be plated with gold so as to reduce the contact resistance.

The plurality of tips 92*a* are arranged so as to have a predetermined interval thereamong and integrally formed with the body 92*c*. The tip 92*a* includes a removal portion 93*a* configured to remove an insulating material such as a thin film or a residual of an organic matter on the substrate, and an electric contact portion 93*b* configured to come into contact with a region on the substrate in which the insulating material has been removed. In the electric contact 92 shown in FIG. 4, the removal portion 93*a* is the end of the tip 92*a*, and the electric contact portion 93*b* is a protruding portion formed in the tip 92*a*.

Figure 5A:
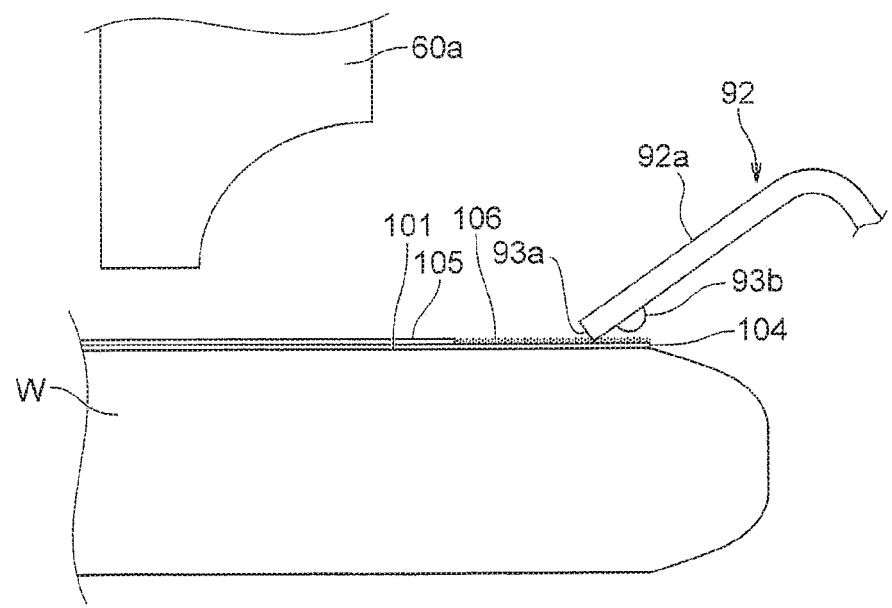
FIG. 5A shows a partial enlarged sectional view of a substrate holder according to the present embodiment.
Figure 5B:
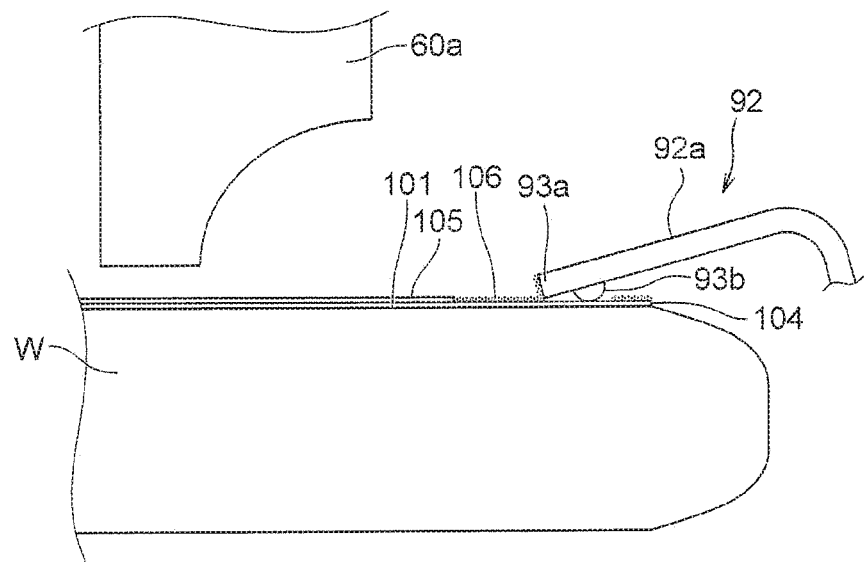
FIG. 5B shows a partial enlarged sectional view of the substrate holder according to the present embodiment.
Figure 5C:
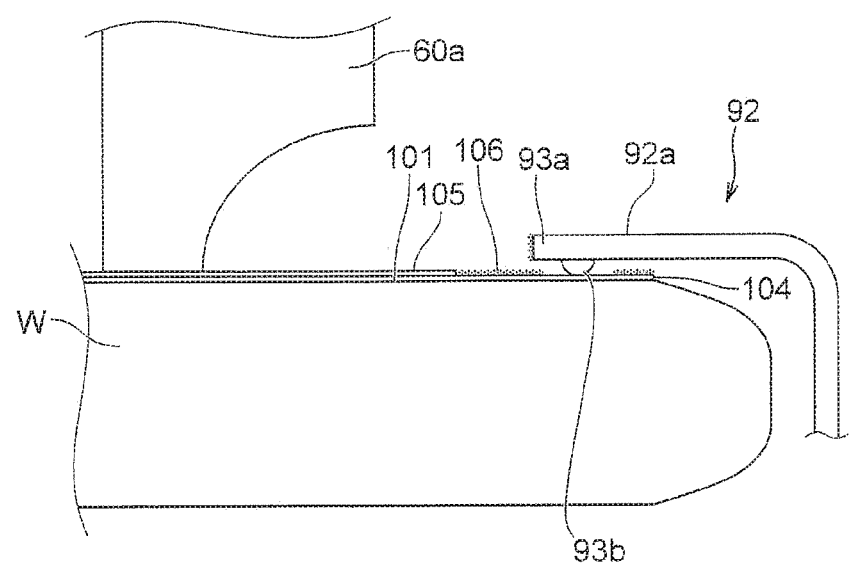
FIG. 5C shows a partial enlarged sectional view of the substrate holder according to the present embodiment.

The substrate holder 18 according to the present embodiment is configured such that at the time of holding the substrate, the removal portion 93*a* of the electric contact 92 removes the insulating material on the substrate, and the electric contact portion 93*b* comes into contact with the region on the substrate in which the insulating material has been removed. Therefore, even when the insulating material such as the thin film or the residual of the organic matter is on the substrate, the substrate holder 18 according to the present embodiment can bring the electric contact 92 into direct contact with the seed layer of the substrate and prevent variations in contact resistance between each of the electric contacts 92 and the substrate. In the following, a description will be given of the function of the electric contact 92 at the time of holding the substrate in the substrate holder 18 shown in FIG. 2 to FIG. 3B. FIGS. 5A to 5C show partial enlarged sectional views of the substrate holder 18 according to the present embodiment. In FIGS. 5A to 5C, the lip portion 60*a* of the second holding member 66, the substrate W, and the tip 92*a* of the electric contact 92, shown in FIGS. 3A and 3B, are enlarged and shown.

As shown in FIG. 5A, the substrate W has a front planar portion 101 which is a flat surface on the plated surface side. A seed layer 104 is formed on the front planar portion 101, and a resist 105 is formed on the seed layer 104. The seed layer 104 is exposed on the outer circumference side of the substrate W so that the electric contact 92 comes into contact with the seed layer 104. An insulating material 106, such as an insulating thin film or a residual of an organic matter, has adhered to the portion in which the seed layer 104 is exposed.

Further, as shown in FIG. 5A, the removal portion 93*a* is provided closer to the front end side of the tip 92*a* of the electric contact 92 than the electric contact portion 93*b* is. The tip 92*a* is inclined downward from the body 92*c* of the electric contact 92, not shown. Thus, when the first holding member 65 and the second holding member 66 shown in FIG. 2 are disposed facing each other, the removal portion 93*a* of the tip 92*a* is located closer to the substrate W (i.e., the holding surface 68 shown in FIG. 2) than the electric contact portion 93*b* is. Accordingly, when the second holding member 66 is brought closer to the first holding member 65 shown in FIG. 2, the removal portion 93*a* comes into contact with the seed layer 104 of the substrate W earlier than the electric contact portion 93*b* as shown in FIG. 5A. The tip 92*a* extends from the body 92*c* not vertically or horizontally but in an inclined manner with respect to the front planar portion 101 of the substrate W.

When the first holding member 65 and the second holding member 66 are brought further closer to each other from the state shown in FIG. 5A, the tip 92*a* is curved by being pressed to the substrate W, and the removal portion 93*a* slides on the substrate W toward the center of the substrate W, as shown in FIG. 5B. Thereby, the removal portion 93*a* scrapes and removes the insulating material 106 on the seed layer 104.

When the first holding member 65 and the second holding member 66 are brought further closer to each other from the state shown in FIG. 5B to bring the lip portion 60*a* into contact with the resist 105 of the substrate W, as shown in FIG. 5C, the tip 92*a* is further curved, and the electric contact portion 93*b* comes into contact with the region on the substrate W in which the removal portion 93*a* has removed the insulating material 106. As shown in FIG. 5C, the removal portion 93*a* is preferably separated from the surface of the substrate W when the electric contact portion 93*b* comes into contact with the seed layer 104. Hence the electric continuity is provided between the electric contact 92 and the seed layer 104 only by the electric contact portion 93*b*, resulting in further prevention of variations in contact resistance among the plurality of electric contacts 92. As described above, the removal portion 93*a* preferably has no electric continuity with the seed layer 104. Thus, when the removal portion 93*a* is not separated from the surface of the substrate W, it may be considered that the surface of the removal portion 93*a* is covered with an insulator such as Teflon (registered trademark) so as to prevent the electric continuity between the removal portion 93*a* and the seed layer 104. However, the surface of the removal portion 93*a* of the substrate holders 18 according to the present embodiment or other embodiments described below is not covered with the insulator in consideration of the removal portion 93*a* sliding with the surface of the substrate W. With such an insulator being softer than metal, even if the surface of the removal portion 93*a* is covered with the insulator, as the substrate holder 18 is repeatedly used, the insulator might be peeled off due to the removal portion 93a sliding with the surface of the substrate W, finally causing the removal portion 93a to have electric continuity with the seed layer 104.

Figure 6A:
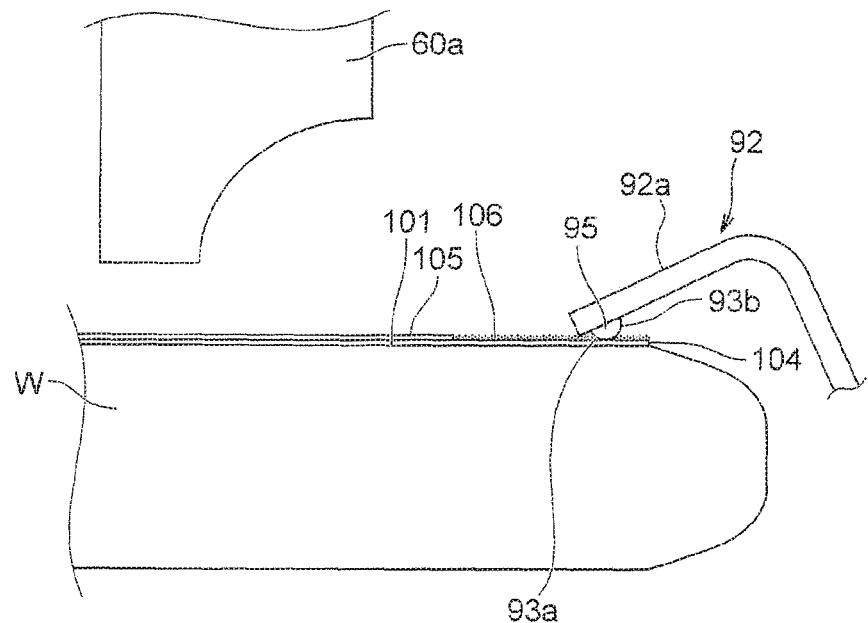
FIG. 6A shows a partial enlarged sectional view of a substrate holder according to another embodiment.
Figure 6B:
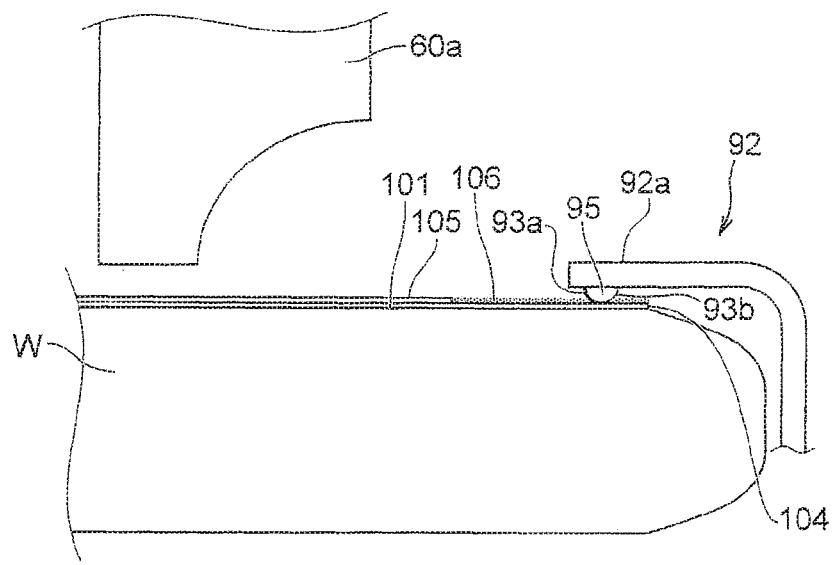
FIG. 6B shows a partial enlarged sectional view of the substrate holder according to the other embodiment.
Figure 6C:
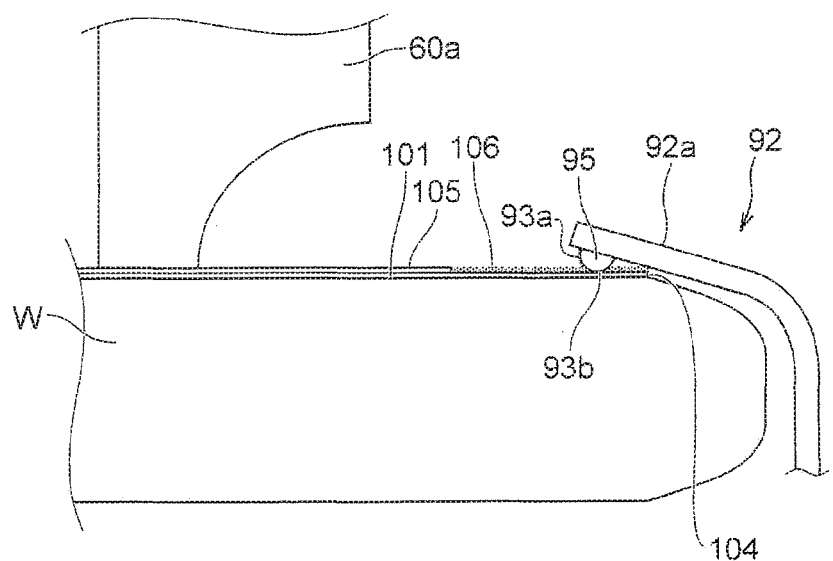
FIG. 6C shows a partial enlarged sectional view of the substrate holder according to the other embodiment.

Next, the substrate holder 18 according to another embodiment will be described. FIGS. 6A to 6C show partial enlarged sectional views of the substrate holder 18 according to the other embodiment. This substrate holder 18 has a similar configuration to that of the substrate holder 18 shown in FIG. 2 except for including an electric contact 92 in a different shape from the electric contact 92 shown in FIG. 4. As shown in FIG. 6A, this electric contact 92 has a protruding portion 95 on the lower surface of the tip 92a. This protruding portion 95 has a substantially semi-circular shape in cross section shown in FIG. 6A. The tip 92a extends from the body 92c not vertically or horizontally but in an inclined manner with respect to the front planar portion 101 of the substrate W.

When the second holding member 66 shown in FIG. 2 is brought closer to the first holding member 65, the surface of the protruding portion 95, located on the front end side of the tip 92a, first comes into contact with the seed layer 104 of the substrate W as shown in FIG. 6A. When the first holding member 65 and the second holding member 66 are brought further closer to each other from the state shown in FIG. 6A, the tip 92a is curved by being pressed to the substrate W, and the protruding portion 95 rotates and slides on an area in contact with the seed layer 104, while being in contact with the seed layer 104, as shown in FIG. 6B. Thereby, the protruding portion 95 scrapes and removes the insulating material 106 on the seed layer 104. At this time, the protruding portion 95 may slide on the substrate W toward the center of the substrate W.

When the first holding member 65 and the second holding member 66 are brought further closer to each other from the state shown in FIG. 6B to bring the lip portion 60a into contact with the resist 105 of the substrate W, as shown in FIG. 6C, the tip 92a is further curved by being pressed to the substrate W, and the protruding portion 95 further slides on the area in contact with the seed layer 104. Thereby, the surface to which no insulating material 106 of the protruding portion 95 has adhered comes into contact with the region on the substrate W in which the insulating material 106 has been removed.

As described concerning FIGS. 6A and 6B, the surface of the protruding portion 95 which first comes into contact with the seed layer 104 functions as the removal portion 93a for removing the insulating material 106 on the substrate W. The surface of the protruding portion 95 which functions as the removal portion 93a can be referred to as the surface of the protruding portion 95 which is located the closest to the holding surface 68 (see FIG. 2) when the first holding member 65 and the second holding member 66 are disposed facing each other. Further, as described concerning FIG. 6C, the surface of the protruding portion 95 which is located closer on the root side (the opposite side from the front end side) than the removal portion 93a functions as the electric contact portion 93b in contact with the region on the substrate W in which the removal portion 93a has removed the insulating material 106. As shown in FIG. 6C, when the electric contact portion 93b comes into contact with the seed layer 104, the removal portion 93a is separated from the surface of the substrate W.

As described above, the removal portions 93a shown in FIGS. 5A to 6C are each located closer to the holding surface 68 than the electric contact portion 93b is when the first holding member 65 and the second holding member 66 are disposed facing each other. Accordingly, when the substrate W is put between the first holding member 65 and the second holding member 66, the removal portion 93a surely comes into contact with the surface of the substrate W earlier than the electric contact portion 93b. Hence the removal portion 93a removes the insulating material 106 on the substrate W, enabling the electric contact portion 93b to come into direct contact with the region on the seed layer 104 in which the insulating material 106 has been removed. Accordingly, as shown in FIGS. 5A to 6C, even when the insulating material 106 is on the surface of the seed layer 104 of the substrate W, it is possible to prevent variations in contact resistance between each of the plurality of electric contacts 92 and the seed layer 104.

The electric contact 92 shown in FIGS. 5A to 5C has the electric contact portion 93b in the protruding shape, and hence the removal portion 93a is separated from the surface of the substrate W when the electric contact portion 93b comes into contact with the seed layer 104. Also in the electric contact 92 shown in FIGS. 6A to 6C, the removal portion 93a is separated from the surface of the substrate W when the electric contact portion 93b comes into contact with the seed layer 104. When the removal portion 93a comes into contact with the seed layer 104 of the substrate W to which the removed insulating material 106 has adhered, the removal portion 93a might affect the contact resistance between the electric contact 92 and the seed layer 104 to cause occurrence of variations in contact resistance among the plurality of electric contacts 92. Therefore, as in the embodiments shown in FIGS. 5A to 6C, the removal portion 93a is separated from the seed layer 104 at the time of the electric contact portion 93b coming into contact with the seed layer 104, thereby enabling the electric continuity between the electric contact 92 and the seed layer 104 to be provided only by the electric contact portion 93b. This can result in further prevention of variations in contact resistance among the plurality of electric contacts 92.

With the electric contact 92 including both the removal portion 93a and the electric contact portion 93b, the number of components can be made small as compared with a case where the removal portion 93a and the electric contact portion 93b are configured in different components.

Figure 7A:
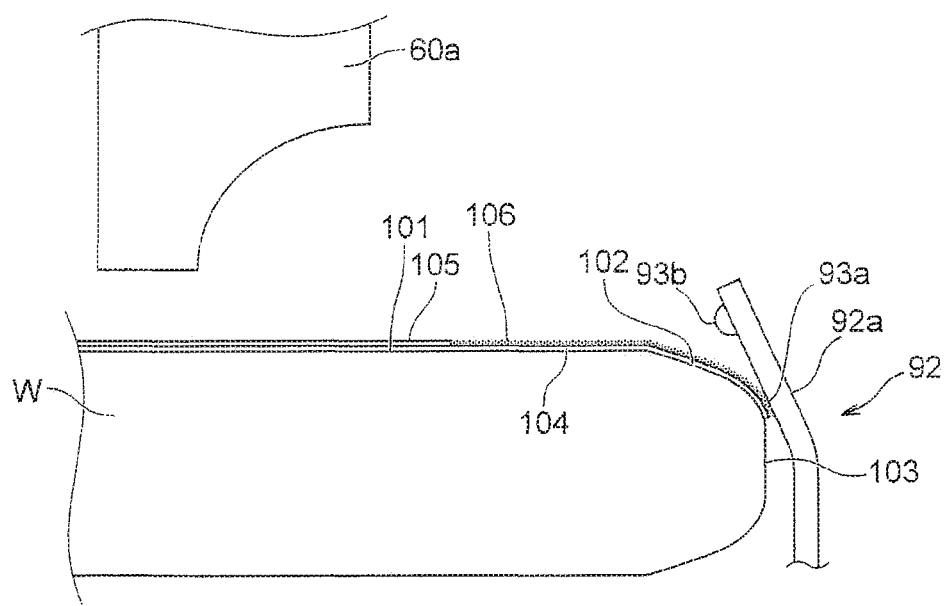
FIG. 7A shows a partial enlarged sectional view of a substrate holder according to another embodiment.
Figure 7B:
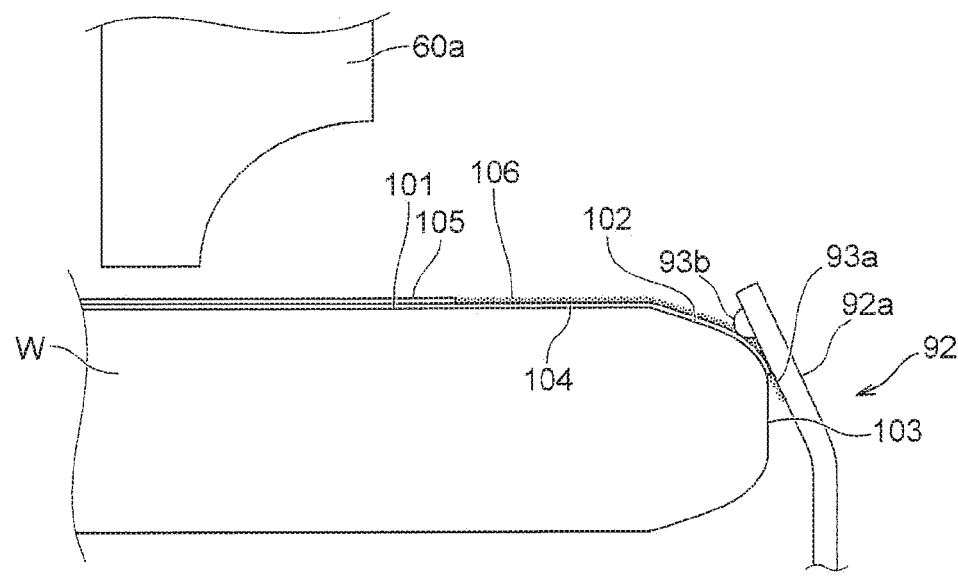
FIG. 7B shows a partial enlarged sectional view of the substrate holder according to the other embodiment.
Figure 7C:
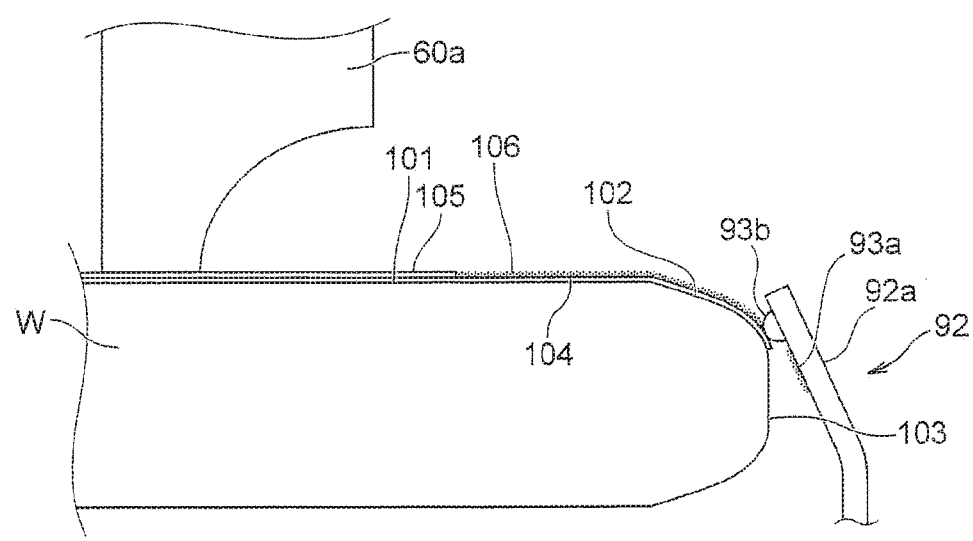
FIG. 7C shows a partial enlarged sectional view of the substrate holder according to the other embodiment.

Next, a description will be given of the substrate holder 18 according to another embodiment which includes an electric contact to be brought into contact with a bevel portion of the substrate W. FIGS. 7A to 7C show partial enlarged sectional views of the substrate holder 18 according to the other embodiment. This substrate holder 18 has a similar configuration to that of the substrate holder 18 shown in FIG. 2 except for including an electric contact in a different shape from the electric contact 92 shown in FIG. 4.

As shown in FIG. 7A, in addition to the front planar portion 101 being the flat surface on the plated surface side, the substrate W includes an apex portion 103 which is the end surface substantially vertical to the front planar portion 101, and a bevel portion 102 between the front planar portion 101 and the apex portion 103. The seed layer 104 is formed between the front planar portion 101 and the bevel portion 102. The resist 105 is formed on the seed layer 104 located on the front planar portion 101. The seed layer 104 is exposed on the outer circumference side of the front planar portion 101 and the bevel portion 102, so that the electric contact 92 comes into contact with the seed layer 104. The insulating material 106, such as an insulating thin film or a residual of an organic matter, has adhered to the portion in which the seed layer 104 is exposed.

As shown in FIG. 7A, in the present embodiment, the electric contact 92 is disposed such that the tip 92a extends from the first holding member 65 of the substrate holder 18 toward the second holding member 66, which are not shown. The tip 92a has the front end inclined toward the center direction of the substrate W, and includes the electric contact portion 93b on its front end side, and the side surface portion closer to the root side (the opposite side from the front end) than the electric contact portion 93b of the tip 92a functions as the removal portion 93a. In other words, similarly to the electric contacts 92 shown in FIGS. 5a to 6C, the electric contact 92 according to the present embodiment is configured such that the removal portion 93a is located closer to the holding surface 68 than the electric contact portion 93b is when the first holding member 65 and the second holding member 66 are disposed facing each other. The removal portion 93a and the electric contact portion 93b are both located on the holding surface 68 (see FIG. 2) side of the tip 92a.

When the second holding member 66 is brought closer to the first holding member 65 shown in FIG. 2, the removal portion 93a comes into contact with the seed layer 104 on the bevel portion 102 of the substrate W earlier than the electric contact portion 93b as shown in FIG. 7A. When the first holding member 65 and the second holding member 66 are brought further closer to each other from the state shown in FIG. 7A, the removal portion 93a of the tip 92a slides on the surface of the substrate W while being pressed to the seed layer 104 on the bevel portion 102, as shown in FIG. 7B. Thereby, the removal portion 93a scrapes and removes the insulating material 106 on the seed layer 104 located on the bevel portion 102.

When the first holding member 65 and the second holding member 66 are brought further closer to each other from the state shown in FIG. 7B to bring the lip portion 60a into contact with the resist 105 of the substrate W, the tip 92a moves further downward, and as shown in FIG. 7C, the electric contact portion 93b comes into contact with the region on the substrate W in which the removal portion 93a has removed the insulating material 106. As shown in FIG. 7C, the removal portion 93a is preferably separated from the surface of the substrate W when the electric contact portion 93b comes into contact with the seed layer 104.

As described above, in the electric contact shown in FIGS. 7A to 7C, the electric contact portion 93b is provided closer to the front end side of the tip 92a than the removal portion 93a is, and the tip 92a is provided so as to extend in the direction from the holding surface 68 of the first holding member 65 toward the second holding member 66. Thus, as shown in FIGS. 7A to 7C, the removal portion 93a and the electric contact portion 93b can be brought into contact with the seed layer 104 on the bevel portion 102 of the substrate W.

Figure 8A:
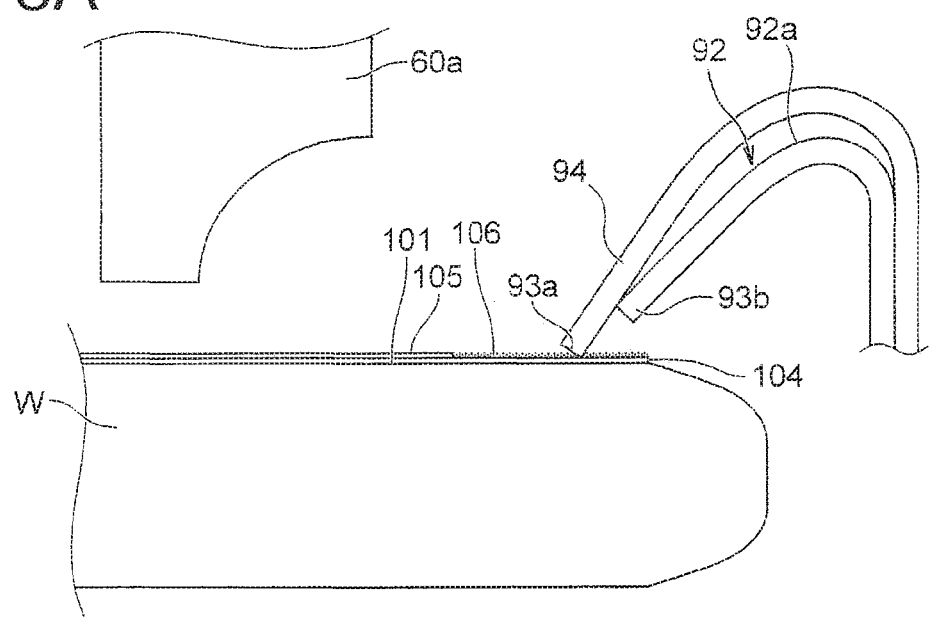
FIG. 8A shows a partial enlarged sectional view of a substrate holder according to another embodiment.
Figure 8B:
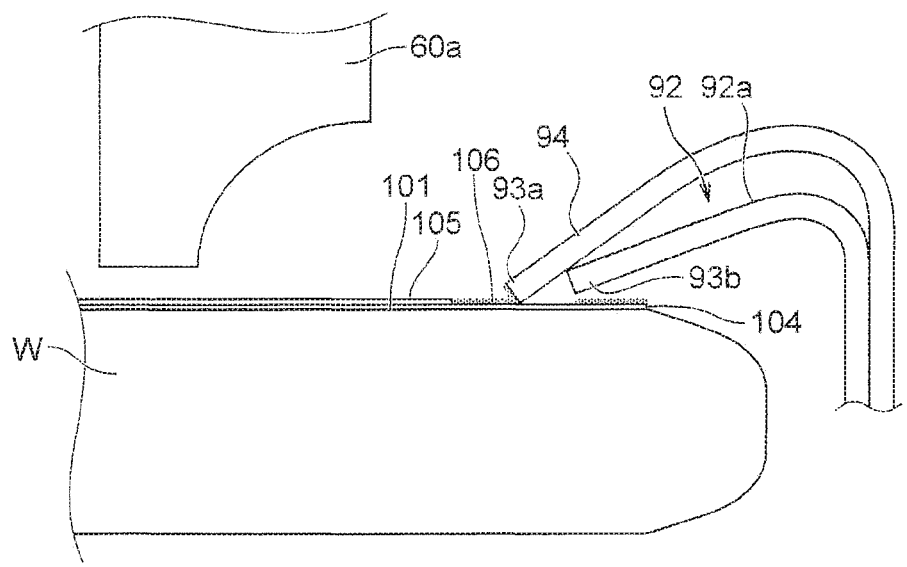
FIG. 8B shows a partial enlarged sectional view of the substrate holder according to the other embodiment.
Figure 8C:
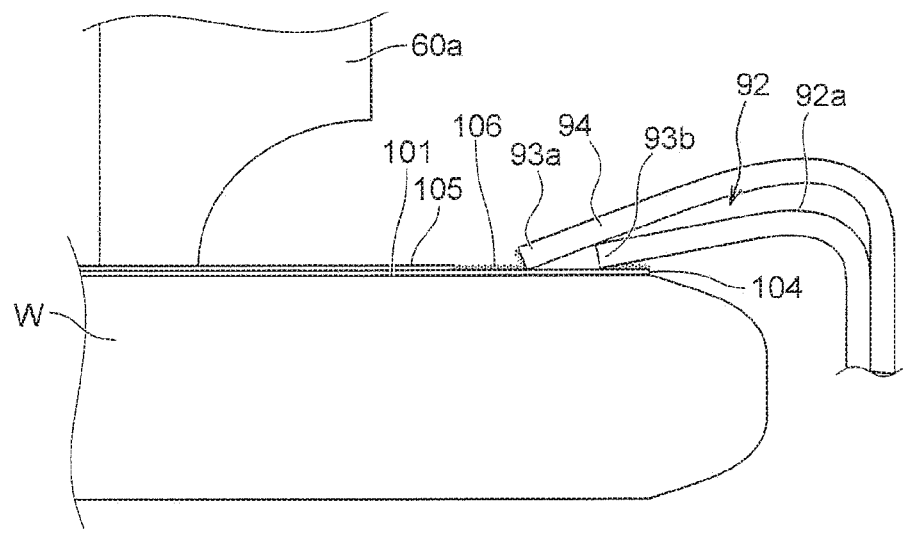
FIG. 8C shows a partial enlarged sectional view of the substrate holder according to the other embodiment.

Next, a description will be given of the substrate holder 18 according to another embodiment including a removal member in addition to the electric contact. FIGS. 8A to 8C show partial enlarged sectional views of the substrate holder 18 according to the other embodiment. This substrate holder 18 has a similar configuration to that of the substrate holder 18 shown in FIG. 2 except for including an electric contact in a different shape from the electric contact 92 shown in FIG. 4 and including the removal member.

As shown in FIG. 8A, this substrate holder 18 includes the electric contact 92 and a removal member 94 having a similar shape to the electric contact 92. The electric contact 92 has a similar shape to the electric contact 92 shown in FIG. 4, but do not include the removal portion 93a. The tip 92a of the electric contact 92 constitutes the electric contact portion 93b that comes into contact with the seed layer 104 of the substrate W.

The removal member 94 can be formed of a freely selectable material having elasticity, such as synthetic resin or metal, and can be fixed to the support 90 shown in FIGS. 3A and 3B in a similar manner to that for the electric contact 92. The removal member 94 is disposed so as be superimposed on the outer side of the electric contact 92, and the tip thereof constitutes the removal portion 93a. The front end of the removal member 94 extends not vertically or horizontally but in an inclined manner with respect to the front planar portion 101 of the substrate W. As shown in FIG. 8A, the removal portion 93a is located closer to the holding surface 68 (see FIG. 2) than the electric contact portion 93b of the electric contact 92 is when the first holding member 65 and the second holding member 66 are disposed facing each other.

In the state shown in FIG. 8A, the electric contact portion 93b of the tip 92a is biased by the removal member 94 toward the radially outer side (the right side in FIG. 8A) of the first holding member 65. That is, the removal member 94 and the tip 92a are in a state where the elastic force of each member acts so as to push each other, and the elastic force of the removal member 94 exceeds the elastic force of the tip 92a. As a result, the tip 92a of the electric contact 92 is in the state of being pressed to the radially outer side of the first holding member 65.

When the second holding member 66 shown in FIG. 8 is brought closer to the first holding member 65, as shown in FIG. 8A, the removal portion 93a, located on the front end of the removal member 94, first comes into contact with the seed layer 104 of the substrate W. When the first holding member 65 and the second holding member 66 are brought further closer to each other from the state shown in FIG. 8A, the removal member 94 is curved and the removal portion 93a slides on the substrate W toward the center of the substrate W, as shown in FIG. 8B. Thereby, the removal portion 93a scrapes and removes the insulating material 106 on the seed layer 104. At this time, the removal portion 93a of the removal member 94 moves toward the center of the substrate W, and hence the tip 92a of the electric contact 92 moves toward the center of the substrate W by its own elasticity.

When the first holding member 65 and the second holding member 66 are brought further closer to each other from the state shown in FIG. 8B to bring the lip portion 60a into contact with the resist 105 of the substrate W, as shown in FIG. 8C, the removal member 94 is further curved and moves to the center of the substrate W. Accordingly, the electric contact portion 93b of the tip 92a moves toward the center of the substrate W by its own elasticity and comes into contact with the region on the substrate W in which the removal portion 93a has removed the insulating material 106. In a case where the removal member 94 is formed of a conductive metal, as shown in FIG. 8C, when the electric contact portion 93b comes into contact with the seed layer 104, it is preferable to separate the removal portion 93a from the surface of the substrate W by the tip 92a of the electric contact 92 pushing up the removal member 94 from the surface of the substrate W. Hence the electric continuity between the electric contact 92 and the seed layer 104 can be provided only by the electric contact portion 93b. This can result in prevention of variations in contact resistance among the plurality of electric contacts 92.

Figure 9A:
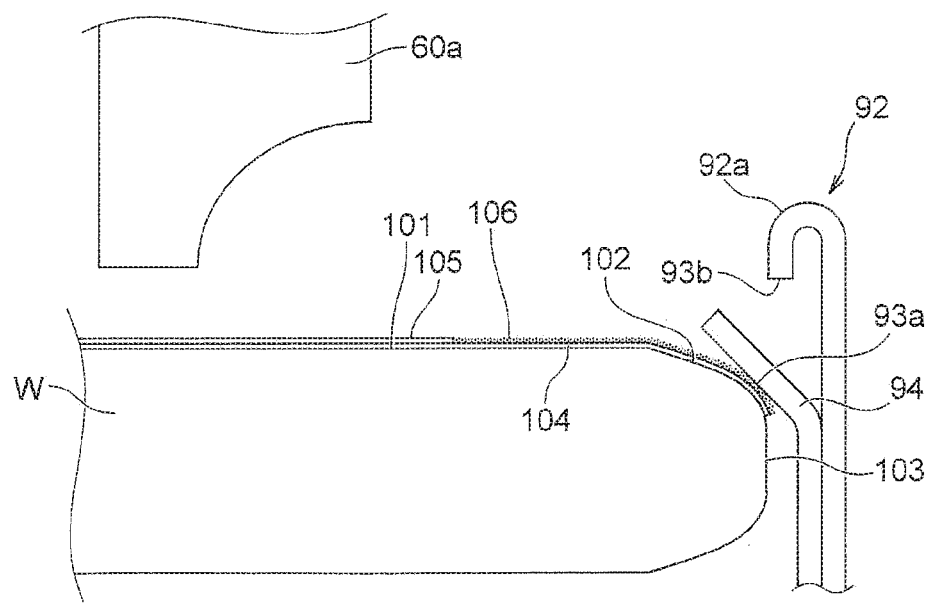
FIG. 9A shows a partial enlarged sectional view of a substrate holder according to another embodiment.
Figure 9B:
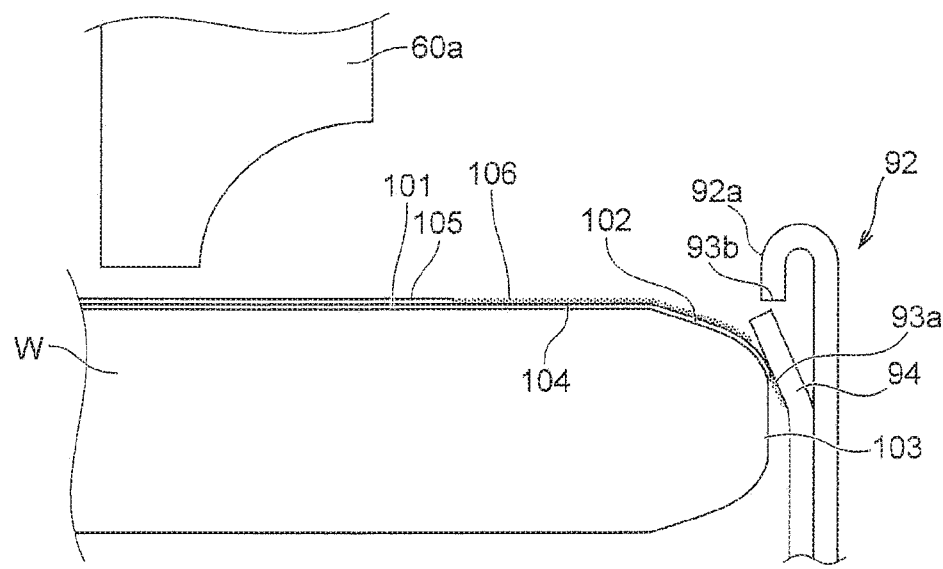
FIG. 9B shows a partial enlarged sectional view of the substrate holder according to the other embodiment.
Figure 9C:
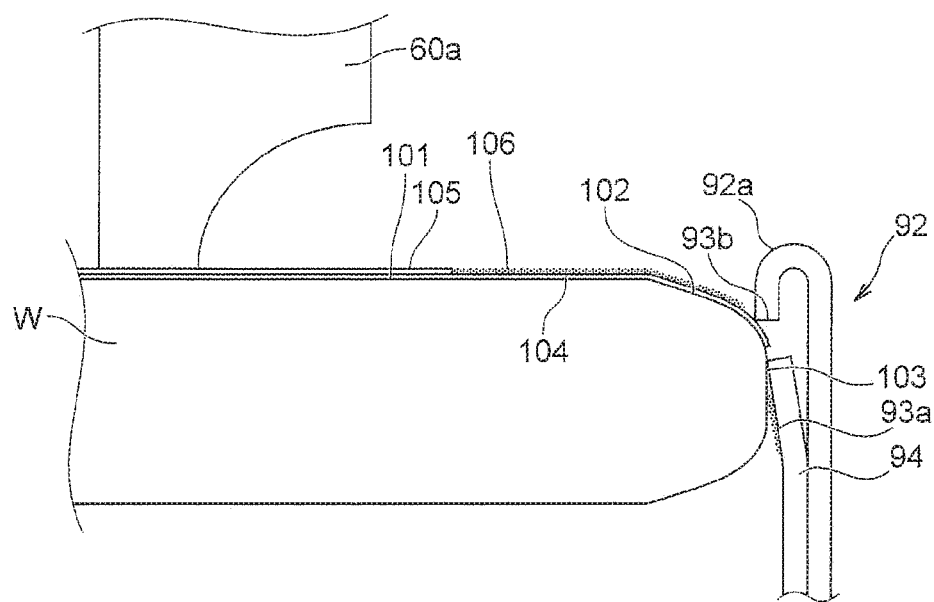
FIG. 9C shows a partial enlarged sectional view of the substrate holder according to the other embodiment.

Next, a description will be given of the substrate holder 18 according to another embodiment which includes an electric contact to be brought into contact with a bevel portion of the substrate W. FIGS. 9A to 9C show partial enlarged sectional views of the substrate holder 18 according to the other embodiment. This substrate holder 18 has a similar configuration to that of the substrate holder 18 shown in FIG. 2 except for including an electric contact 92 in a different shape from the electric contact 92 shown in FIG. 4 and including the removal member 94.

As shown in FIG. 9A, the substrate holder 18 according to the present embodiment can hold a substrate W having a similar configuration to that of the substrate W shown in FIGS. 7A to 7C. As shown in FIG. 9A, in the present embodiment, the substrate holder 18 includes the electric contact 92 and the removal member 94. The electric contact 92 is disposed such that the tip 92a extends from the first holding member 65 of the substrate holder 18 toward the second holding member 66, which are not shown. The tip 92a is bent such that its front end is turned to the bevel portion 102 of the substrate W. In the present embodiment, the front end of the tip 92a functions as the electric contact portion 93b. The removal member 94 is located closer to the substrate W side than the electric contact 92 is, and the front end of the removal member 94 is inclined toward the center direction of the substrate W. In the present embodiment, the side surface portion of the removal member 94 functions as the removal portion 93a. As shown in FIG. 9A, the removal portion 93a is located closer to the holding surface 68 (see FIG. 2) than the electric contact portion 93b of the electric contact 92 is when the first holding member 65 and the second holding member 66 are disposed facing each other.

When the second holding member 66 is brought closer to the first holding member 65 shown in FIG. 2, the removal portion 93a comes into contact with the seed layer 104 on the bevel portion 102 of the substrate W earlier than the electric contact portion 93b as shown in FIG. 9A. When the first holding member 65 and the second holding member 66 are brought further closer to each other from the state shown in FIG. 9A, the removal portion 93a of the removal member 94 slides on the surface of the substrate W while being pressed to the seed layer 104 on the bevel portion 102, as shown inn FIG. 9B. Thereby, the removal portion 93a scrapes and removes the insulating material 106 on the seed layer 104 located on the bevel portion 102.

When the first holding member 65 and the second holding member 66 are brought further closer to each other from the state shown in FIG. 9B to bring the lip portion 60a into contact with the resist 105 of the substrate W, the tip 92a moves further downward, and as shown in FIG. 9C, the electric contact portion 93b comes into contact with the region on the substrate W in which the removal portion 93a has removed the insulating material 106. As shown in FIG. 9C, the removal portion 93a is preferably separated from the surface of the seed layer 104 when the electric contact portion 93b comes into contact with the seed layer 104.

As described above, the removal portions 93a shown in FIGS. 8A to 9C are each located closer to the holding surface 68 than the electric contact portion 93b is when the first holding member 65 and the second holding member 66 are disposed facing each other. Accordingly, when the substrate W is put between the first holding member 65 and the second holding member 66, the removal portion 93a surely comes into contact with the surface of the substrate W earlier than the electric contact portion 93b. Hence the removal portion 93a removes the insulating material 106 on the substrate W, enabling the electric contact portion 93b to come into direct contact with the region on the seed layer 104 in which the insulating material 106 has been removed. Accordingly, as shown in FIGS. 8A to 9C, even when the insulating material 106 is on the surface of the seed layer 104 of the substrate W, it is possible to prevent variations in contact resistance between each of the plurality of electric contacts 92 and the seed layer 104.

Further, in the present embodiment, the electric contact portion 93b and the removal portion 93a are provided in the different members. Accordingly, when any one of the members is damaged, only the damaged member can be replaced. It is thus possible to reduce cost generated at the time of component replacement as compared with the case of providing the electric contact portion 93b and the removal portion 93a in a single member.

Although the embodiments of the present invention have been described above, the embodiments of the invention described above are intended to facilitate understanding of the present invention and not to limit the present invention. The present invention can be changed and modified without deviating from its gist, and the present invention naturally includes an equivalent thereto. Further, in a range where at least part of the problem described above can be solved or a range where at least part of the effect is exerted, each of the constituents described in the claims and the specification can be combined in a freely selectable manner or can be omitted.

Some aspects disclosed by the present specification will be described below.

According to a first aspect, a substrate holder for holding a substrate is provided. This substrate holder includes: a first holding member having a surface configured to come into contact with the substrate; and a second holding member, between which and the first holding member the substrate is put and held. The second holding member includes a removal portion that is disposed along an outer circumference of the substrate when the substrate is put between the first holding member and the second holding member, and configured to come into contact with the substrate and remove an insulating material on the substrate, and an electric contact portion that is disposed along the outer circumference of the substrate and configured to come into contact with a region on the substrate in which the removal portion has removed the insulating material when the substrate is put and held between the first holding member and the second holding member. The removal portion is located closer to the surface than the electric contact portion is when the first holding member and the second holding member are disposed facing each other.

According to the first aspect, the removal portion is located closer to the surface than the electric contact portion is when the first holding member and the second holding member are disposed facing each other. Thus, when the substrate is put between the first holding member and the second holding member, the removal portion surely comes into contact with the surface of the substrate earlier than the electric contact portion. Hence the removal portion removes the insulating material on the substrate, enabling the electric contact portion to come into direct contact with the region on the substrate in which the insulating material has been removed. Therefore, even when the insulating material is on the substrate surface, it is possible to prevent variations in contact resistance between each of the plurality of electric contacts and the substrate.

According to a second aspect, in the substrate holder of the first aspect, the second holding member includes an electric contact for allowing a current to flow on the substrate by coming into contact with the substrate, and the electric contact includes the removal portion and the electric contact portion. According to the second aspect, with the electric contact including both the removal portion and the electric contact portion, the number of components can be made small as compared with a case where the removal portion and the electric contact portion are configured in different components.

According to a third aspect, in the substrate holder of the second aspect, the first holding member includes a relay contact configured to feed a current from an external power source to the electric contact, the electric contact includes a leg that comes into contact with the relay contact when the substrate is put and held between the first holding member and the second holding member, a body extending from the leg, and a tip extending in an inclined manner from the body, the tip includes the removal portion and the electric contact portion, and the electric contact portion is a protruding portion configured to protrude from the tip.

According to the third aspect, the electric contact portion is a protruding portion protruding from the tip, and hence the removal portion of the electric contact can be separated from the substrate when the electric contact portion comes into contact with the surface of the seed layer. When the removal portion comes into contact with the seed layer of the substrate to which the removed insulating material has adhered, the removal portion might affect the contact resistance between the electric contact and the seed layer to cause occurrence of variations in contact resistance among the plurality of electric contacts. Therefore, the removal portion is separated from the seed layer when the electric contact portion comes into contact with the seed layer, thereby enabling the electric continuity between the electric contact and the seed layer to be provided only by the electric contact portion. This can result in further prevention of variations in contact resistance among the plurality of electric contacts.

According to a fourth aspect, in the substrate holder of the third aspect, the removal portion is provided closer to a front end side of the tip than the electric contact portion is. According to the fourth aspect, the removal portion is provided on the front end side of the tip, and the removal portion is located closer to the surface of the first holding member than the electric contact portion is when the first holding member and the second holding member are disposed facing each other. That is, the front end side of the tip is located so as to be turned to the planar portion of the substrate. Therefore, according to the fourth aspect, the removal portion and the electric contact portion can be brought into contact with the seed layer on the planar portion of the substrate when the substrate is held between the first holding member and the second holding member.

According to a fifth aspect, in the substrate holder of the third aspect, the electric contact portion is provided closer to the front end side of the tip than the removal portion is. According to the fifth aspect, the electric contact portion is provided closer to a front end side of the tip than the removal portion is, and the removal portion is located closer to the surface of the first holding member than the electric contact portion is when the first holding member and the second holding member are disposed facing each other. That is, the tip is located so as to extend in the direction from the surface of the first holding member toward the second holding member. In this case, when the tip is disposed on the periphery of the substrate, the removal portion and the electric contact portion can be brought into contact with the seed layer on the bevel portion of the substrate.

According to a sixth aspect, in the substrate holder of the first aspect, the second holding member includes an electric contact for allowing a current to flow on the substrate by coming into contact with the substrate, and a removal member for removing the insulating material on the substrate, the electric contact includes the electric contact portion, and the removal member includes the removal portion.

According to the sixth aspect, the electric contact portion and the removal portion are provided in different members. Accordingly, when any one of the members is damaged, only the damaged member can be replaced. It is thus possible to reduce the cost generated at the time of component replacement as compared with the case of providing the electric contact portion and the removal portion in a single member.

According to a seventh aspect, in the substrate holder of any one of the first to sixth aspects, the removal portion is configured to be separated from the substrate when the substrate is put and held between the first holding member and the second holding member.

According to the seventh aspect, the removal portion of the electric contact can be separated from the substrate. When the removal portion comes into contact with the seed layer of the substrate to which the removed insulating material has adhered, the removal portion might affect the contact resistance between the electric contact and the seed layer to cause occurrence of variations in contact resistance among the plurality of electric contacts. Therefore, the removal portion is separated from the substrate when the electric contact portion comes into contact with the seed layer, thereby enabling the electric continuity between the electric contact and the seed layer to be provided only by the electric contact portion. This can result in further prevention of variations in contact resistance among the plurality of electric contacts.

According to an eighth aspect, in the substrate holder of any one of the first to seventh aspects, the removal portion is configured to slide on the substrate when the substrate is put and held between the first holding member and the second holding member, after the removal portion comes into contact with the substrate until the substrate holder holds the substrate. According to the eighth aspect, the removal portion slides on the substrate, and hence the removal portion can scrape and remove the insulating material in a predetermined region on the substrate.

According to a ninth aspect, in the substrate holder of any one of the first to eighth aspects, the second holding member includes a plurality of electric contacts for allowing a current to flow on the substrate by coming into contact with the substrate, each of the electric contacts includes the electric contact portion; and the plurality of electric contacts are electrically connected to each other.

According to the ninth aspect, with the plurality of electric contacts electrically connected to each other, even when the electric contacts are connected to the external power source through respectively different wires, the electric contacts each have the same potential, and hence currents to be fed by the electric contacts to the substrate can be made uniform.

According to a tenth aspect, there is provided a plating apparatus which performs plating treatment on a substrate by using the substrate holder of any one of the first to ninth aspects.

According to an eleventh, there is provided a plating method for plating a substrate held in a substrate holder including a first holding member and a second holding member. This plating method includes the steps of: putting the substrate between the first holding member and the second holding member to hold the substrate in the substrate holder; and plating the substrate held in the substrate holder. The holding step includes scraping the insulating material on the substrate by using a removal portion provided in the second holding member, and bringing an electric contact portion provided in the second holding member into contact with a region on the substrate in which the removal portion has removed the insulating material.

According to the eleventh aspect, the removal portion removes the insulating material on the substrate, enabling the electric contact portion to come into direct contact with the region on the substrate in which the insulating material has been removed. Therefore, even when the insulating material is on the substrate surface, it is possible to prevent variations in contact resistance between each of the plurality of electric contacts and the substrate.

According to a twelfth aspect, there is provided an electric contact configured to come into contact with the substrate in order to allow a current to flow on the substrate. This electric contact includes: a leg that electrically connected to an external power source; a body extending from the leg; and a tip extending in an inclined manner from the body. The tip includes a removal portion configured to come into contact with the substrate and remove an insulating material on the substrate, and an electric contact portion configured to come into contact with a region on the substrate in which the removal portion has removed the insulating material.

According to the twelfth aspect, the removal portion removes the insulating material on the substrate, and the electric contact portion comes into direct contact with the region on the substrate in which the insulating material has been removed. Therefore, even when the insulating material is on the substrate surface, it is possible to prevent variations in contact resistance between each of the plurality of electric contacts and the substrate.

According to a thirteenth aspect, in the electric contact of the twelfth aspect, the electric contact portion is a protruding portion configured to protrude from the tip. According to the thirteenth aspect, the electric contact portion is a protruding portion protruding from the tip, and hence the removal portion of the electric contact can be separated from the substrate when the electric contact portion comes into contact with the surface of the seed layer. When the removal portion comes into contact with the seed layer of the substrate to which the removed insulating material has adhered, the removal portion might affect the contact resistance between the electric contact and the seed layer to cause occurrence of variations in contact resistance among the plurality of electric contacts. Therefore, the removal portion is separated from the seed layer when the electric contact portion comes into contact with the seed layer, thereby enabling the electric continuity between the electric contact and the seed layer to be provided only by the electric contact portion. This can result in further prevention of variations in contact resistance among the plurality of electric contacts.

According to a fourteenth aspect, in the electric contact portion of the twelfth or thirteenth aspect, the removal portion is provided closer to a front end side of the tip than the electric contact portion is. According to the fourteenth aspect, this electric contact can be used as an electric contact to be brought into contact with the planar portion of the substrate.

According to a fifteenth aspect, in the electric contact portion of the twelfth or thirteenth aspect, the electric contact portion is provided closer to the front end side of the tip than the removal portion is. According to the fifteenth aspect, this electric contact can be used as an electric contact to be brought into contact with the bevel portion of the substrate.

REFERENCE SIGNS LIST

W substrate
1 plating apparatus
18 substrate holder
65 first holding member
66 second holding member
68 holding surface
88 relay contact
92 electric contact
94 removal member
95 protruding portion
106 insulating material
92a tip
92b leg
92c body
93a removal portion
93b electric contact portion

What is claimed is:

1. A substrate holder for holding a substrate, comprising:
a first holding member having a surface configured to come into contact with the substrate; and
a second holding member, between which and the first holding member the substrate is put and held,
wherein
the second holding member includes
a removal portion that is disposed along an outer circumference of the substrate when the substrate is put between the first holding member and the second holding member, and configured to come into contact with the substrate and remove an insulating material on the substrate, and
an electric contact portion that is disposed along the outer circumference of the substrate and configured to come into contact with a region on the substrate in which the removal portion has removed the insulating material when the substrate is put and held between the first holding member and the second holding member,
the removal portion is located closer to the surface than the electric contact portion is when the first holding member and the second holding member are disposed facing each other,
the removal portion is positioned closer to a center of the substrate than the electric contact portion or closer to a circumferential edge of the substrate than the electric contact portion,
the second holding member includes an electric contact for allowing a current to flow on the substrate by coming into contact with the substrate,
the electric contact includes the removal portion and the electric contact portion,
the first holding member includes a relay contact configured to feed a current from an external power source to the electric contact,
the electric contact includes a leg that comes into contact with the relay contact when the substrate is put and held between the first holding member and the second holding member, a body extending from the leg, and a tip extending in an inclined manner from the body,
the tip includes the removal portion and the electric contact portion, and
the electric contact portion is a protruding portion configured to protrude from the tip.

2. The substrate holder according to claim 1, wherein the removal portion is provided closer to a front end side of the tip than the electric contact portion is.

3. The substrate holder according to claim 1, wherein the electric contact portion is provided closer to a front end side of the tip than the removal portion is.

4. The substrate holder according to claim 1, wherein
the second holding member includes an electric contact for allowing a current to flow on the substrate by coming into contact with the substrate, and a removal member for removing the insulating material on the substrate,
the electric contact includes the electric contact portion, and
the removal member includes the removal portion.

5. The substrate holder according to claim 1, wherein the removal portion is configured to be separated from the substrate when the substrate is put and held between the first holding member and the second holding member.

6. The substrate holder according to claim 1, wherein the removal portion is configured to slide on the substrate when the substrate is put and held between the first holding member and the second holding member, after the removal portion comes into contact with the substrate until the substrate holder holds the substrate.

7. The substrate holder according to claim 1, wherein
the second holding member includes a plurality of electric contacts for allowing a current to flow on the substrate by coming into contact with the substrate,
each of the electric contacts includes the electric contact portion, and
the plurality of electric contacts are electrically connected to each other.

8. A plating apparatus which performs plating treatment on a substrate by using the substrate holder according to claim 1.

9. A plating method for plating a substrate held in the substrate holder according to claim 1, the method comprising the steps of:
putting the substrate between the first holding member and the second holding member to hold the substrate in the substrate holder; and
plating the substrate held in the substrate holder,
wherein
the holding step includes
scraping the insulating material on the substrate by using the removal portion provided in the second holding member, and
bringing the electric contact portion provided in the second holding member and positioned closer to the center of the substrate than the removal portion or closer to the circumferential edge of the substrate than the removal portion into contact with a region on the substrate in which the removal portion has removed the insulating material.

10. An electric contact, configured to come into contact with a substrate in order to allow a current to flow on the substrate, the contact comprising
a leg that is electrically connected to an external power source;
a body extending from the leg; and
a tip extending in an inclined manner from the body, and the tip includes
a removal portion configured to come into contact with the substrate and remove an insulating material on the substrate, and
an electric contact portion configured to come into contact with a region on the substrate in which the removal portion has removed the insulating material.

11. The electric contact according to claim 10, wherein the electric contact portion is a protruding portion configured to protrude from the tip.

12. The electric contact according to claim 10, wherein the removal portion is provided closer to a front end side of the tip than the electric contact portion is.

13. The electric contact according to claim 10, wherein the electric contact portion is provided closer to the front end side of the tip than the removal portion is.

* * * * *